United States Patent
Ide et al.

(10) Patent No.: US 10,754,206 B2
(45) Date of Patent: *Aug. 25, 2020

(54) DISPLAY DEVICE

(71) Applicant: Japan Display Inc., Minato-ku (JP)

(72) Inventors: Tatsuya Ide, Tokyo (JP); Daisuke Sonoda, Tokyo (JP); Yasushi Tomioka, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/276,011

(22) Filed: Feb. 14, 2019

(65) Prior Publication Data
US 2019/0179186 A1    Jun. 13, 2019

Related U.S. Application Data

(63) Continuation of application No. 15/636,781, filed on Jun. 29, 2017, now Pat. No. 10,247,988.

(30) Foreign Application Priority Data

Jul. 1, 2016 (JP) .................................. 2016-131828

(51) Int. Cl.
| H01L 51/00 | (2006.01) |
| G02F 1/1343 | (2006.01) |
| G02F 1/1333 | (2006.01) |
| G02F 1/1345 | (2006.01) |
| G02F 1/1335 | (2006.01) |
| G02F 1/136 | (2006.01) |
| G02F 1/1362 | (2006.01) |

(52) U.S. Cl.
CPC ............ *G02F 1/1343* (2013.01); *G02F 1/136* (2013.01); *G02F 1/13452* (2013.01); *G02F 1/133308* (2013.01); *G02F 1/133509* (2013.01); *H01L 51/0097* (2013.01); *G02F 1/133514* (2013.01); *G02F 1/136286* (2013.01); *G02F 2001/133334* (2013.01); *G02F 2202/22* (2013.01); *H01L 2251/5338* (2013.01); *Y02E 10/549* (2013.01)

(58) Field of Classification Search
CPC ........................... H01L 27/3272; H01L 51/56
See application file for complete search history.

(56) References Cited

U.S. PATENT DOCUMENTS

| 9,660,007 B2 | 5/2017 | Tsuruoka | |
| 2014/0138640 A1* | 5/2014 | Kim | ........................ H01L 51/56 257/40 |
| 2015/0060778 A1 | 3/2015 | Kim et al. | |

FOREIGN PATENT DOCUMENTS

JP    2015-50181    3/2015

* cited by examiner

*Primary Examiner* — Trang Q Tran
(74) *Attorney, Agent, or Firm* — Oblon, McClelland, Maier & Neustadt, L.L.P.

(57) ABSTRACT

According to one embodiment, a display device includes an insulating substrate including a first surface, and a second surface opposite to the first surface, a circuit board mounted on the first surface, a supporting member adhered to the insulating substrate on the second surface, and an antistatic layer located between the insulating substrate and the supporting member.

7 Claims, 9 Drawing Sheets

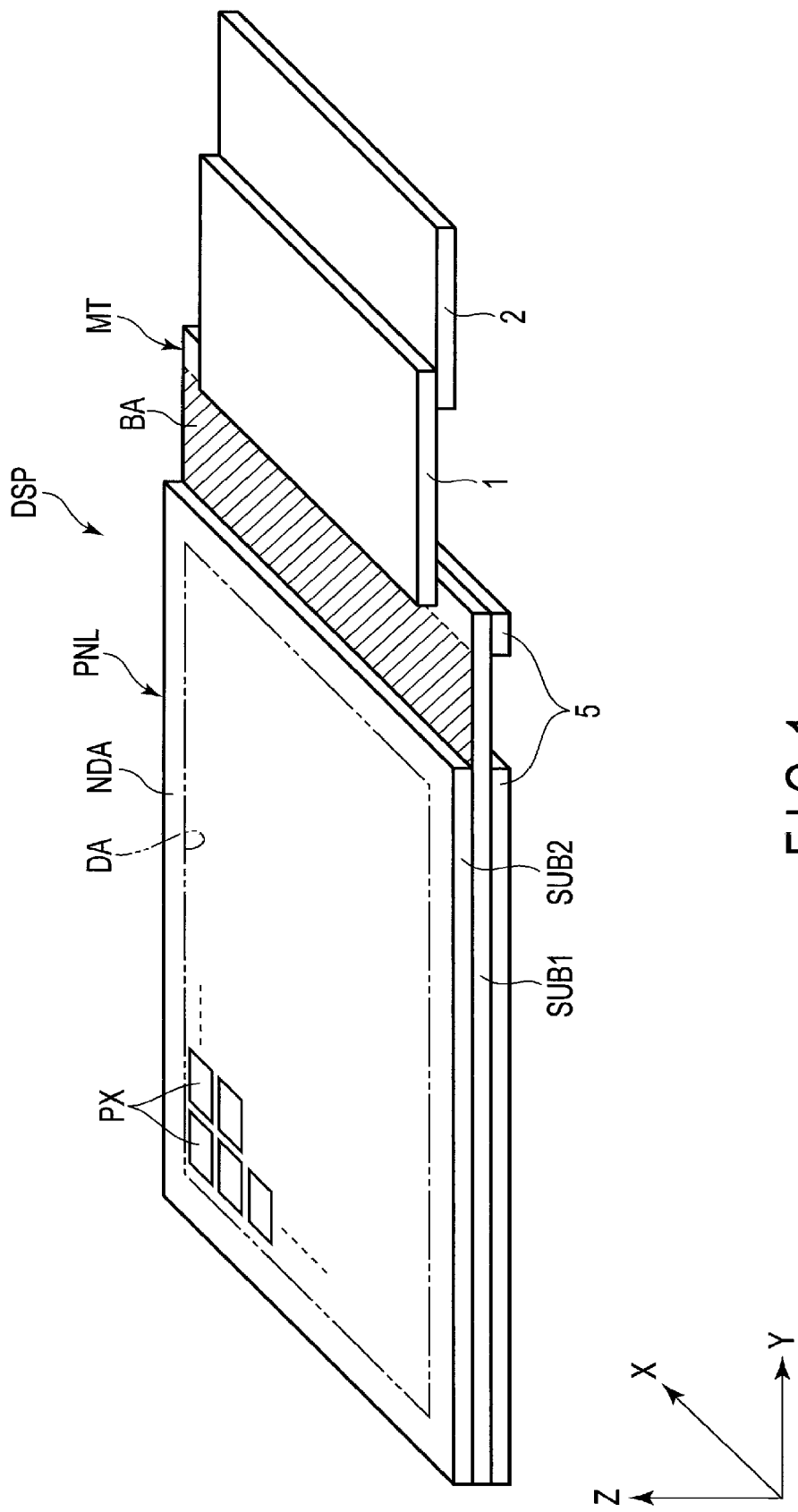
F I G. 1

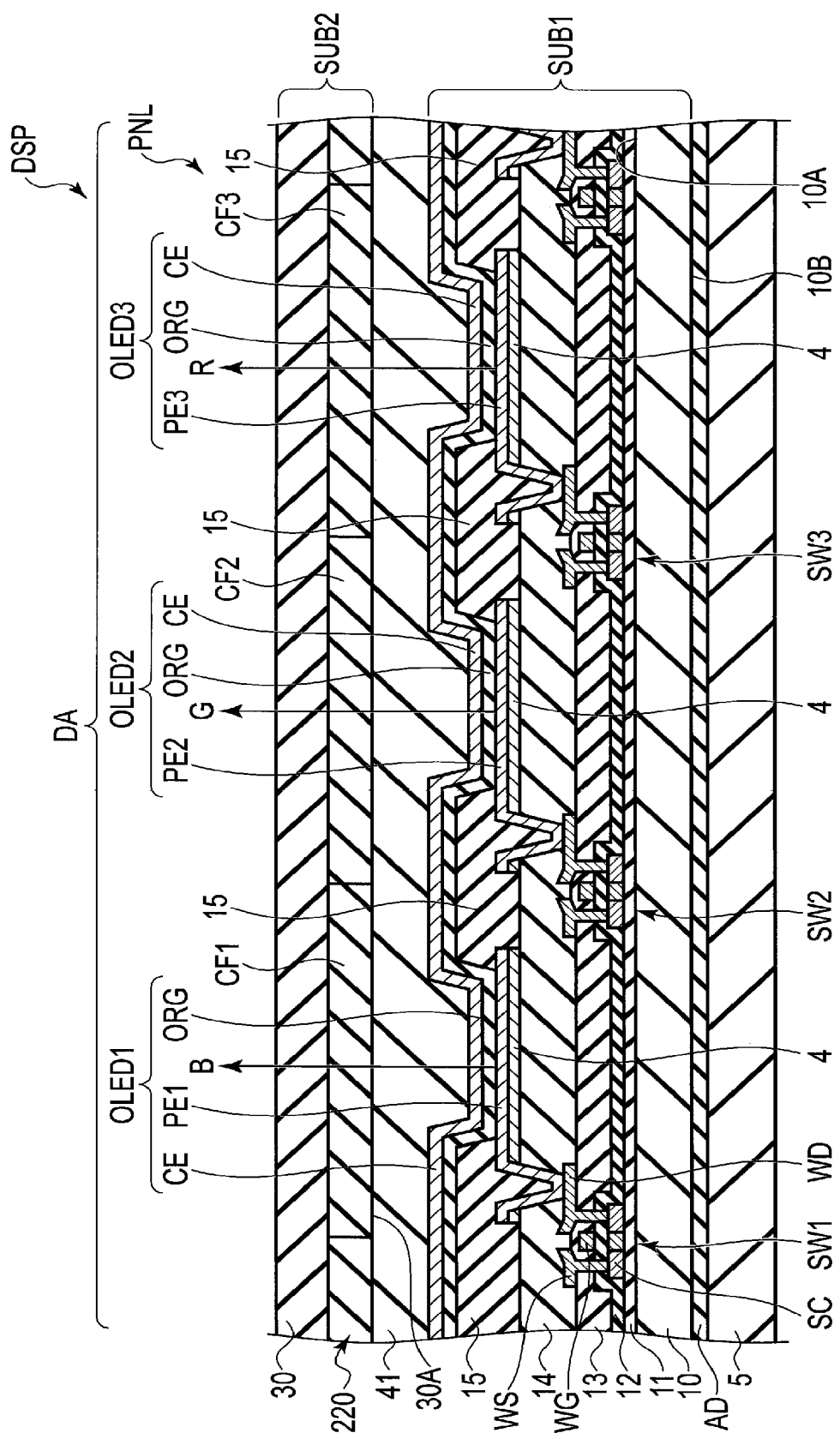
F I G. 2

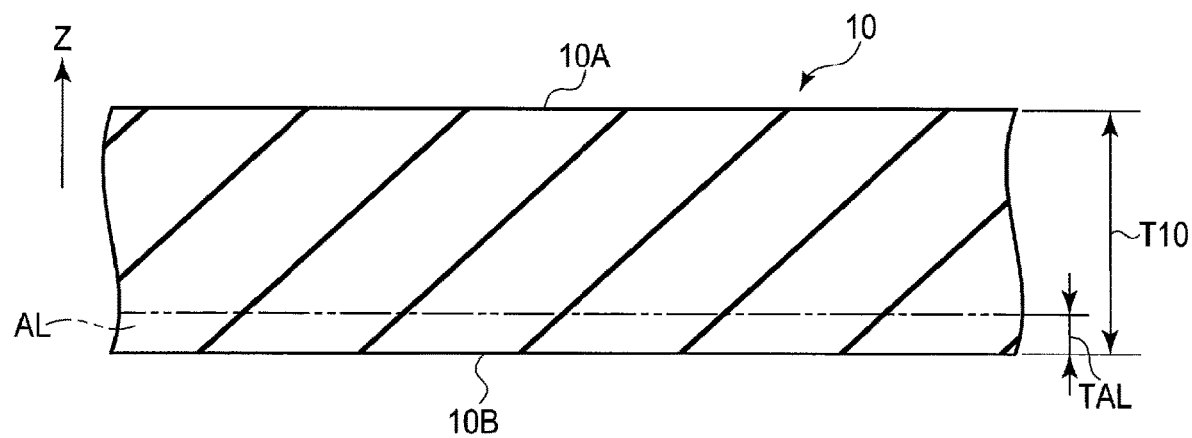
F I G. 4
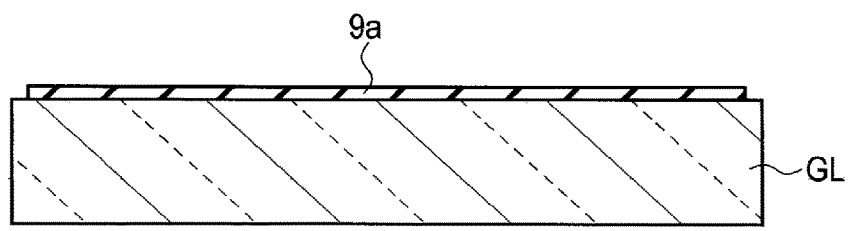
F I G. 5
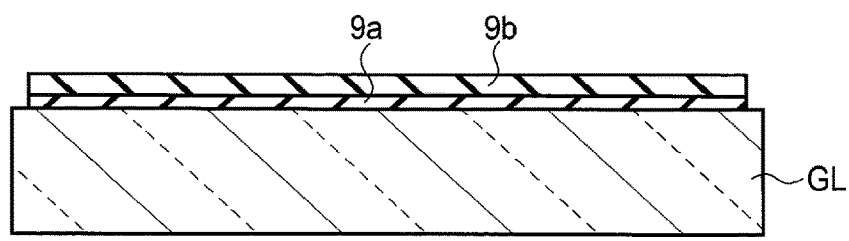
F I G. 6

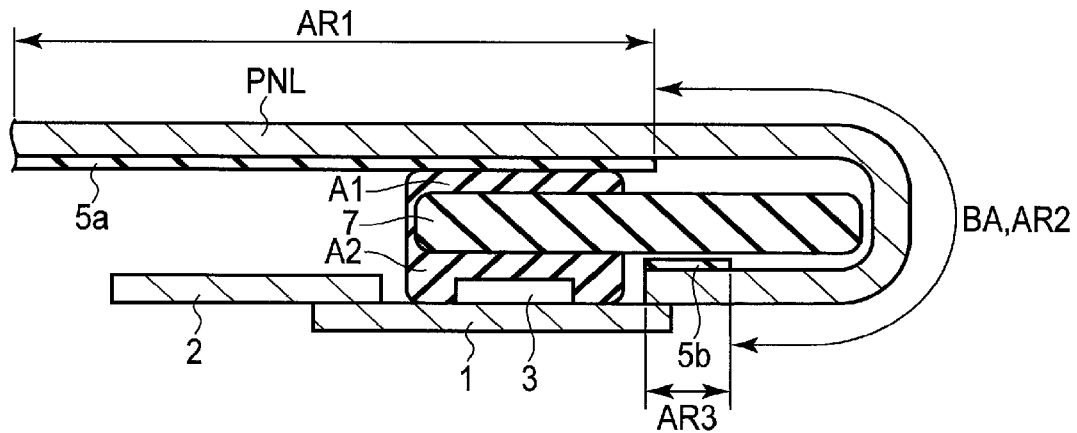
F I G. 13
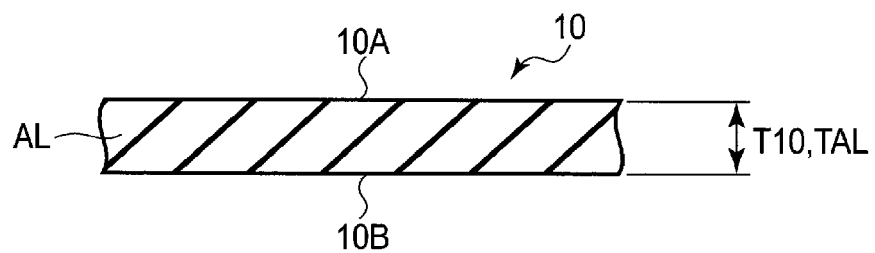
F I G. 14
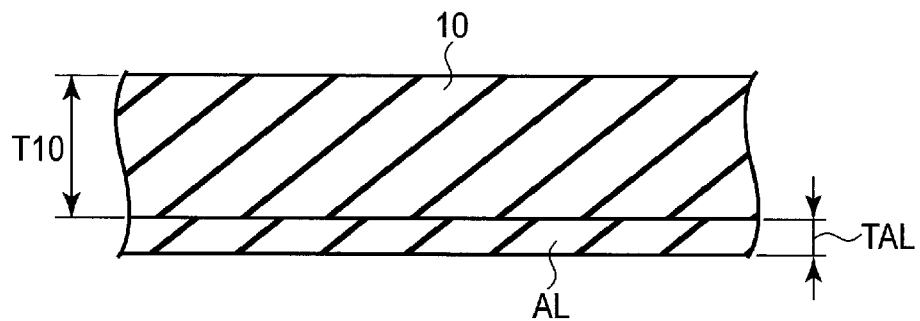
F I G. 15

DISPLAY DEVICE

CROSS-REFERENCE TO RELATED APPLICATIONS

This application is a continuation of U.S. application Ser. No. 15/636,781 filed Jun. 29, 2017 and is based upon and claims the benefit of priority from Japanese Patent Application No. 2016-131828, filed Jul. 1, 2016, the entire contents of each of which are incorporated herein by reference.

FIELD

Embodiments described herein relate generally to a display device.

BACKGROUND

In recent years, sheet-like displays using flexible substrates have been developed for commercialization. Sheet-like displays have been drawing attention as lightweight and flat displays. The display panel of each sheet-like display comprises a flexible insulating layer. For example, a PI film (a polyimide precursor solution film coated with a solution containing a polyimide precursor) is used for the insulating layer. In the process for manufacturing the display panel, the insulating layer is formed on a glass substrate used as a base member.

In a process for forming a plurality of display panels using a substrate, the substrate is separated from an insulating layer.

When the substrate is removed from the insulating layer, the insulating layer might be electrically charged, or a foreign substance might be electrostatically adsorbed to the insulating layer.

In a step for separating the substrate from the insulating layer, the insulating layer is removed from the substrate with laser light. To cause laser light to reach the insulating layer, the substrate is subjected to dry cleaning using a brush before laser irradiation. After the dry cleaning, the substrate chip is separated from the insulating layer.

In the step of dry cleaning using a brush and the step for removing the substrate from the insulating layer as described above, the insulating layer might be electrically charged.

If the insulating layer is electrically charged, a foreign substance might be adsorbed to the insulating layer. In addition, electrostatic discharge (ESD) failure might be caused. If ESD failure is caused, the switching elements or capacitive elements of the display panel may be destroyed.

BRIEF DESCRIPTION OF THE DRAWINGS

FIG. 1 is a perspective view showing the structure of a display device according to the present embodiment.

FIG. 2 is a cross-sectional view showing a display area provided in the display device shown in FIG. 1.

FIG. 4 shows an antistatic layer, etc.

FIG. 5 is a cross-sectional view shown for explaining a step for forming a first insulating substrate on a substrate.

FIG. 6 is a cross-sectional view shown for explaining the step for forming the first insulating substrate on the substrate subsequent to FIG. 5.

FIG. 13 is a cross-sectional view showing a state after the bend area of the display panel shown in FIG. 12 is bent.

FIG. 14 is a cross-sectional view showing a modification example of the first insulating substrate of the display panel according to the above embodiment.

FIG. 15 is a cross-sectional view showing a modification example of the antistatic layer of the display panel according to the above embodiment.

DETAILED DESCRIPTION

Figure 3:
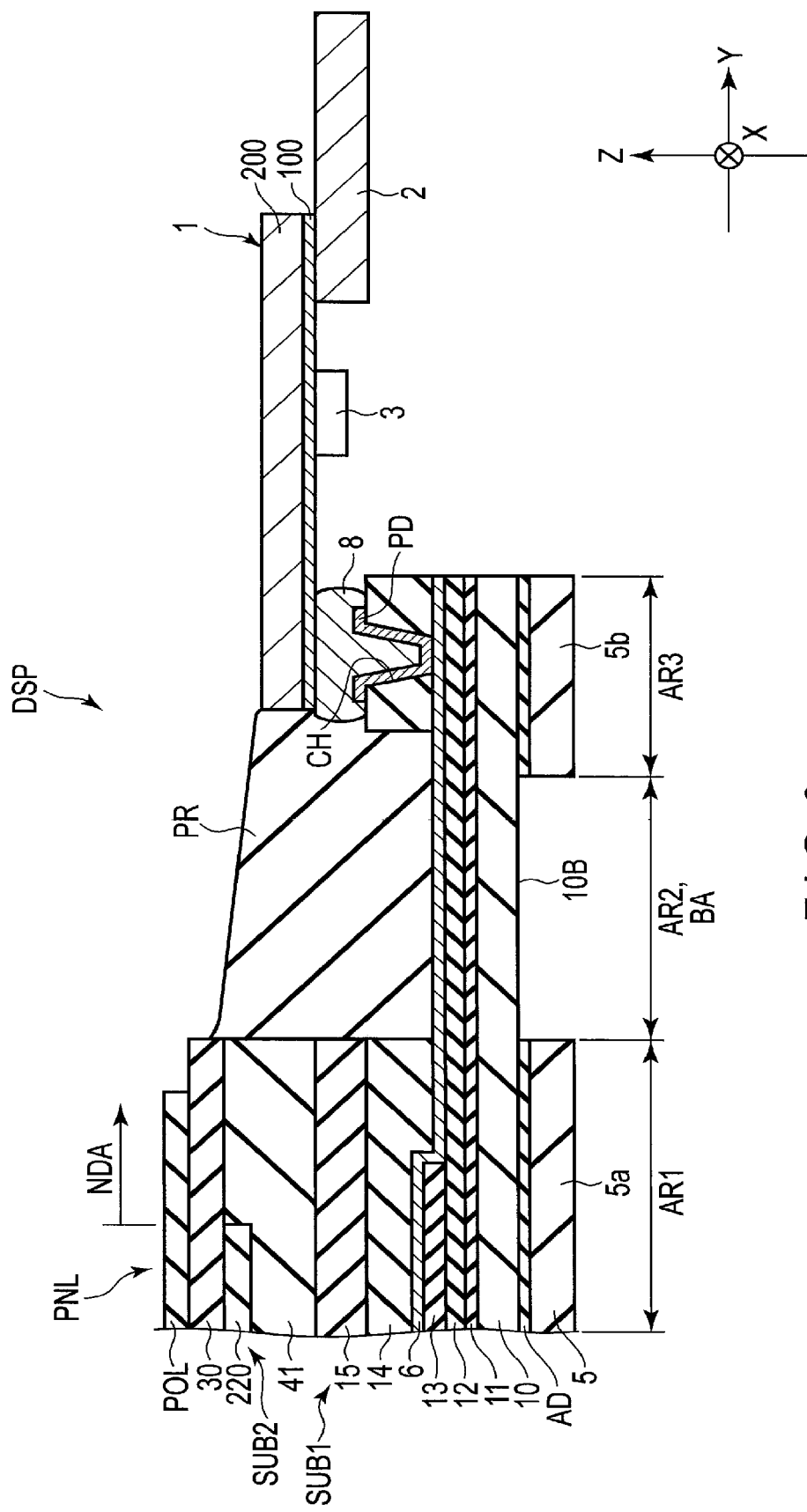
FIG. 3 is another cross-sectional view showing the display device of FIG. 1, and shows a non-display area, etc.

In general, according to one embodiment, there is provided a display device comprising: an insulating substrate comprising a first surface, and a second surface opposite to the first surface; a circuit board mounted on the first surface; a supporting member adhered to the insulating substrate on the second surface; and an antistatic layer located between the insulating substrate and the supporting member.

According to another embodiment, there is provided a display device comprising: an insulating substrate comprising a first area, a second area adjacent to the first area, and a third area adjacent to the second area; a circuit board mounted in the third area of the insulating substrate; and a supporting member adhered to the insulating substrate on a side opposite to a side on which the circuit board is mounted, wherein the insulating substrate is formed of a polyimide substrate containing conductive inorganic particles.

An embodiment will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

To begin with, this specification explains the details of a display device according to an embodiment. FIG. 1 is a perspective view showing the structure of a display device DSP according to the present embodiment.

As shown in FIG. 1, a first direction X is perpendicular to a second direction Y. A third direction Z is perpendicular to the first direction X and the second direction Y. In a manner different from that of the present embodiment, the first direction X and the second direction Y may intersect at an angle other than 90°. In the present embodiment, the display device is assumed to be an organic electro-luminescent display device.

In the present embodiment, the third direction Z is defined as an upward direction. The opposite direction of the third direction Z is defined as a downward direction. When this specification uses the phrases "a second member above a first member" and "a second member under a first member", the second member may be in contact with the first member, or may be separated from the first member. In the latter case, a third member may be interposed between the first member and the second member. When this specification uses the phases "a second member on a first member" and "a second member directly under a first member", the second member is in contact with the first member.

The display device DSP comprises a display panel PNL, a circuit board 1, a flexible printed circuit 2 and a supporting substrate 5. The display panel PNL comprises a plate-like first substrate SUB1 and a plate-like second substrate SUB2 facing the first substrate SUB1. In the present embodiment, the display panel PNL is an organic electro-luminescent display panel.

The display panel PNL comprises a display area DA which displays an image, and a non-display area NDA which surrounds the display area DA. The display panel PNL comprises a plurality of pixels PX in the display area DA. The pixels PX are arranged in matrix in the first direction X and the second direction Y.

The first substrate SUB1 comprises a mounting portion MT extending to the external side in comparison with the area in which the first substrate SUB1 overlaps the second substrate SUB2. More specifically, three side edges of the first substrate SUB1 are aligned with three side edges of the second substrate SUB2 in the third direction Z. The length of each of side edges of the first substrate SUB1 parallel to the first direction X is substantially equal to the length of each of side edges of the second substrate SUB2 parallel to the first direction X. Each of the side edges of the first substrate SUB1 parallel to the second direction Y are longer than each of the side edges of the second substrate SUB2 parallel to the second direction Y. Thus, the area of the first substrate SUB1 parallel to the X-Y plane is greater than the area of the second substrate SUB2 parallel to the X-Y plane. The X-Y plane is a plane defined by the first direction X and the second direction Y. In the present embodiment, the length of each of the side edges of the second substrate SUB2 parallel to the second direction Y may be substantially equal to the length of each of the side edges of the first substrate SUB1 parallel to the second direction Y. In this case, the area of the first substrate SUB1 parallel to the X-Y plane is substantially equal to the area of the second substrate SUB2 parallel to the X-Y plane.

In the example of FIG. 1, the circuit board 1 is mounted above the mounting portion MT in the non-display area NDA. In the example of FIG. 1, the side edges of the circuit board 1 parallel to the first direction X are shorter than the side edges of the first and second substrates SUB1 and SUB2 parallel to the first direction X. However, the length of the side edges of the circuit board 1 parallel to the first direction X may be equal to the length of the side edges of the first and second substrates SUB1 and SUB2 parallel to the first direction X. The display panel PNL is electrically connected to the circuit board 1. The flexible printed circuit 2 is provided under the circuit board 1.

In the present embodiment, the display device DSP comprises a bend area BA which is bent when the display device DSP is put in the housing of an electronic device, etc. In FIG. 1, the bend area BA is diagonally shaded. The bend area BA is bent such that the circuit board 1 and the flexible printed circuit 2 are provided on the lower side of the display area DA. The bend area BA is located in the non-display area NDA.

The supporting member 5 is located under the display panel PNL and is adhered to the first substrate SUB1. The supporting member 5 is provided so as not to overlap the bend area BA in the third direction Z.

FIG. 2 is a cross-sectional view showing the display area DA of the display device DSP shown in FIG. 1.

As shown in FIG. 2, the first substrate SUB1 comprises a first insulating substrate 10, switching elements SW1, SW2 and SW3, a reflective layer 4, organic electro-luminescent elements OLED1, OLED2 and OLED3, a sealing layer 41, and the supporting member 5. The first insulating substrate 10 is formed of an organic insulating material such as polyimide. Thus, in some cases, the first insulating substrate 10 is preferably referred to as an organic insulating substrate (resinous substrate). Alternatively, the first insulating substrate 10 is preferably referred to as an insulating layer, an organic insulating layer or a resinous layer. The first insulating substrate 10 comprises a first surface 10A, and a second surface 10B opposite to the first surface 10A. The first insulating substrate 10 is covered with a first insulating film 11.

The switching elements SW1, SW2 and SW3 are arranged above the first insulating film 11. In the example of FIG. 2, the switching elements SW1, SW2 and SW3 are top-gate thin-film transistors. However, they may be bottom-gate thin-film transistors. The switching elements SW1, SW2 and SW3 have the same structure. Thus, the detailed structure of the switching element SW1 is explained as a typical example. The switching element SW1 comprises a semiconductor layer SC arranged on the first insulating film 11. The semiconductor layer SC is covered with a second insulating film 12. The second insulating film 12 is also provided on the first insulating film 11.

The switching element SW1 comprises a gate electrode WG arranged on the second insulating film 12 and located right above the semiconductor layer SC. The gate electrode WG is covered with a third insulating film 13. The third insulating film 13 is also provided on the second insulating film 12.

The first insulating film 11, the second insulating film 12 and the third insulating film 13 are formed of an inorganic material such as silicon oxide or silicon nitride.

The switching element SW1 comprises a source electrode WS and a drain electrode WD on the third insulating film 13. The source electrode WS and the drain electrode WD are electrically connected to the semiconductor layer SC via respective contact holes penetrating the second insulating film 12 and the third insulating film 13. The switching element SW1 is covered with a fourth insulating film 14. The fourth insulating film 14 is also provided on the third insulating film 13. The fourth insulating film 14 is formed of an organic material such as transparent resin.

The reflective layer 4 is arranged on the fourth insulating film 14. The reflective layer 4 is formed of a highly light-reflective metal material such as aluminum or silver. Note that the surface of the reflective layer 4 (that is, the surface on the second substrate SUB2 side) may be flat, or may be irregular to impart light scattering properties.

The organic electro-luminescent elements OLED1 to OLED3 are arranged on the fourth insulating film 14. In the example of FIG. 2, the organic electro-luminescent element OLED1 is electrically connected to the switching element SW1. The organic electro-luminescent element OLED2 is electrically connected to the switching element SW2. The organic electro-luminescent element OLED3 is electrically connected to the switching element SW3. Each of the organic electro-luminescent elements OLED1 to OLED3 is configured as a top-emission type which emits white light toward the second substrate SUB2. These organic electro-luminescent elements OLED1 to OLED3 have the same structure.

The organic electro-luminescent element OLED1 comprises a pixel electrode PE1 formed on the reflective layer 4. The pixel electrode PE1 is in contact with the drain electrode WD of the switching element SW1, and is electrically connected to the switching element SW1. Similarly, the organic electro-luminescent element OLED2 comprises a pixel electrode PE2 electrically connected to the switching element SW2. The organic electro-luminescent element OLED3 comprises a pixel electrode PE3 electrically connected to the switching element SW3. The pixel electrodes PE1, PE2 and PE3 are formed of a transparent conductive material such as indium tin oxide (ITO) or indium zinc oxide (IZO).

Each of the organic electro-luminescent elements OLED1 to OLED3 further comprise an organic light emitting layer ORG and a common electrode CE. One of each pixel electrode PE and the common electrode CE is a positive electrode. The other one is a negative electrode. The organic light emitting layers ORG is located on the pixel electrodes PE1 to PE3. The common electrode CE is located on the organic light emitting layer ORG. The common electrode CE is formed of a transparent conductive material such as ITO or IZO. In the example of FIG. 2, the organic electro-luminescent elements OLED1 to OLED3 are defined by ribs 15. Although not shown in FIG. 2, a transparent sealing film is preferably used to seal in the organic electro-luminescent elements OLED1 to OLED3.

In a manner different from that of the present embodiment, each of the organic electro-luminescent elements may be configured as a bottom-emission type which emits light toward the first insulating substrate 10. In this case, various adjustments are applied. For example, the position of the reflective layer 4 is adjusted.

The sealing layer 41 covers the upper sides of the organic electro-luminescent elements OLED1, OLED2 and OLED3. The sealing layer 41 is formed so as to seal in the members provided between the first insulating substrate 10 and the sealing layer 41. The sealing layer 41 prevents intrusion of oxygen or moisture into the organic electro-luminescent elements OLED1, OLED2 and OLED3, and degradation of the organic electro-luminescent elements OLED1, OLED2 and OLED3. The sealing layer 41 may be formed as a stacked layer including an inorganic film and an organic film.

The second substrate SUB2 comprises a second insulating substrate 30, and a color filter 220. The second insulating substrate 30 is provided above the sealing layer 41. The second insulating substrate 30 may be a glass substrate or a resinous substrate, or may be an optical element including an optical film, a polarizer, etc. The second insulating substrate 30 is adhered to, for example, the sealing layer 41.

The color filter 220 is provided on the inner surface 30A side of the second insulating substrate 30. The color filter 220 comprises colored layers CF1, CF2 and CF3. The colored layers CF1, CF2, and CF3 are formed of resinous materials of different colors. For example, the colored layer CF1 is a blue layer. The colored layer CF2 is a green layer. The colored layer CF3 is a red layer. The color filter 220 may further include a white or transparent layer. The colored layers CF1, CF2 and CF3 face the organic electro-luminescent elements OLED1, OLED2 and OLED3, respectively.

The supporting member 5 is located under the first substrate SUB1. The supporting member 5 is adhered to the second surface 10B of the first insulating substrate 10 by an adhesive layer AD. The supporting member 5 is preferably formed of, for example, an inexpensive material which exerts a good heat resistance, gas-insulating property, moisture-proof property and strength. For example, the supporting member 5 is resistant to heat to the extent that its properties or shape is not changed by the temperature of the process for manufacturing the display device DSP. For example, the supporting member 5 has a strength greater than that of the first insulating substrate 10, and functions as a supporting layer. When the supporting member 5 is added, the display panel PNL is difficult to bend in a state where no external stress is applied. For example, the supporting member 5 has a moisture-proof property to prevent incursion of moisture, etc., into the first insulating substrate 10 and a gas-insulating property to prevent incursion of gas, and functions as a barrier layer. In the present embodiment, the supporting member 5 is a film formed of, for example, polyethylene terephthalate. In the present embodiment, for example, the thickness of the supporting member 5 (in other words, the width in the third direction Z) is approximately 50 μm.

In the above display device DSP, when the organic electro-luminescent elements OLED1 to OLED3 emit light, the light (white light) is emitted to the outside through the color layers CF1, CF2 and CF3. At this time, the color layer CF1 transmits light having a blue wavelength in the white light emitted from the organic electro-luminescent element OLED1. The color layer CF2 transmits light having a green wavelength in the white light emitted from the organic electro-luminescent element OLED2. The color layer CF3 transmits light having a red wavelength in the white light emitted from the organic electro-luminescent element OLED3. In this way, color display is realized.

Each pixel PX shown in FIG. 1 is, for example, the smallest unit of a color image, and comprises the above organic electro-luminescent elements OLED1 to OLED3.

In the above structural example, the organic electro-luminescent elements OLED1 to OLED3 comprise the common organic light emitting layer ORG. However, the structure is not limited to this example. For example, the organic electro-luminescent element OLED1 may comprise an organic light emitting layer which emits blue light. The organic electro-luminescent element OLED2 may comprise an organic light emitting layer which emits green light. The organic electro-luminescent element OLED3 may comprise an organic light emitting layer which emits red light. In this structural example, the color filter 220 may be omitted.

FIG. 3 is another cross-sectional view showing the display device of FIG. 1, and shows the non-display area, etc.

As shown in FIG. 3, the supporting member 5 comprises a first portion 5a, and a second portion 5b separated from the first portion 5a. The display panel PNL comprises a first area AR1, a second area AR2 adjacent to the first area AR1, and a third area AR3 adjacent to the second area AR2. The second area AR2 is located between the first area AR1 and the third area AR3.

In the present embodiment, a plan view is defined as appearance when the first substrate SUB1 is seen from the second substrate SUB2. The first area AR1 is equivalent to the area overlapping the first portion 5a as seen in plan view. The second area AR2 is equivalent to the area in which the supporting member 5 is not provided as seen in plan view. The third area AR3 is equivalent to the area overlapping the second portion 5b as seen in plan view. The first portion 5a is adhered to the first area AR1 by the adhesive layer AD. The second portion 5b is adhered to the third area AR3 by the adhesive layer AD.

A signal line 6 is continuously provided from the first area AR1 to the third area AR3. The signal line 6 is formed by, for example, a stacked layer containing titanium, aluminum and titanium. The signal line 6 is equivalent to a power line, various control lines, etc. A pad PD is provided in the third area AR3. The pad PD is electrically connected to the signal line 6 via a contact hole CH formed in the fourth insulating film 14.

The circuit board 1 is mounted in the third area AR3. The circuit board 1 comprises a core substrate 200, a connective line 100 provided on the lower surface side of the core substrate 200, and a driver IC chip 3 provided on the lower surface side of the core substrate 200. The driver IC chip 3 functions as a signal supply source which supplies a signal necessary for driving the display panel PNL, etc. The position of the driver IC chip 3 is not particularly limited. The driver IC chip 3 may be provided on the upper surface side of the core substrate 200. The flexible printed circuit 2 is provided on the lower surface side of the circuit board 1.

The display panel PNL and the circuit board 1 are electrically connected and physically attached to each other by an anisotropic conductive film 8 which is a conductive material. The connective line 100 is electrically connected to the signal line 6 via the anisotropic conductive film 8 and the pad PD.

A protective layer PR is provided on the signal line 6. In the example of FIG. 3, the protective layer PR covers an end portion of the rib 15, an end portion of the sealing layer 41 and an end portion of the circuit board 1.

The bend area BA also shown in FIG. 1 is included in the second area AR2. Alternatively, the bend area BA is an area equivalent to the second area AR2. When the bend area BA is bent, the pad PD is provided on the rear side of the display panel PNL.

FIG. 4 shows an antistatic layer AL, etc.

In the example shown in FIG. 4, the first insulating substrate 10 comprises the antistatic layer AL. The antistatic layer AL comprises the second surface 10B, and is formed of an admixture of resin and conductive inorganic particles. Conductive inorganic particles may be, for example, fine particles of metal oxide such as titania, zirconia or antimony, or conductive fine particles such as tin oxide, indium oxide or zinc antimonate. The antistatic layer AL may be formed of only conductive inorganic particles.

The antistatic layer AL faces a plurality of elements such as the switching elements SW. The antistatic layer AL faces the display area DA. In the present embodiment, as seen in plan view, the display area DA is located inside the outline of the antistatic layer AL.

The first insulating substrate 10 is structured as follows. The electrical resistance is the highest on the first surface 10A side. The electrical resistance is the lowest on the second surface 10B side. The electrical resistance is gradually increased from the second surface 10B to the first surface 10A. For example, the sheet resistance of the antistatic layer AL is preferably $10^6$ to $10^{12} \Omega/\square$ ($\Omega$/square). The sheet resistance of the first insulating substrate 10 on the first surface 10A side is $10^{15}$ to $10^{16} \Omega/\square$.

Thickness TAL of the antistatic layer AL is less than the whole thickness T10 of the first insulating substrate 10. Thickness T10 of the first insulating substrate 10 is approximately 10 to 20 μm. Thickness TAL of the antistatic layer AL is less than 200 nm. For example, thickness TAL is less than 100 nm.

The display device DSP is structured as described above.

Now, this specification explains a method for manufacturing the display device DSP.

FIG. 5 is a cross-sectional view shown for explaining a step for forming the first insulating substrate 10 on a substrate GL. The step is started with preparation of the substrate GL. For example, the substrate is formed of glass. An admixture of polyimide and conductive inorganic particles is applied onto the substrate GL. In this way, a low-resistive layer 9a is formed. The thickness of the low-resistive layer 9a is greater than or equal to 200 nm. Subsequently, the low-resistive layer 9a is subjected to baking (pre-baking) at 50 to 200° C. for approximately 10 minutes.

FIG. 6 is a cross-sectional view shown for explaining the step for forming the first insulating substrate 10 on the substrate GL subsequent to FIG. 5.

Subsequently, polyimide is applied onto the low-resistive layer 9a. In this way, a high-resistive layer 9b is formed. The thickness of the high-resistive layer 9b is approximately 10 to 20 μm. Subsequently, the high-resistive layer 9b undergoes baking (main baking) together with the low-resistive layer 9a at 450 to 500° C. for a predetermined time. The conductive inorganic particles are diffused from the low-resistive layer 9a to the high-resistive layer 9b. Thus, a mixed layer is formed between the low-resistive layer 9a and the high-resistive layer 9b.

When the low-resistive layer 9a (as a conductive component) includes a high-polarity metal oxide, a metal complex, a nanocompound thereof or a polar group such as calboxylic acid, the polarity is high. The polarity of the material of the high-resistive layer 9b is lower than that of the low-resistive layer 9a. The more hydrophilic groups, the higher polarity.

Figure 7:
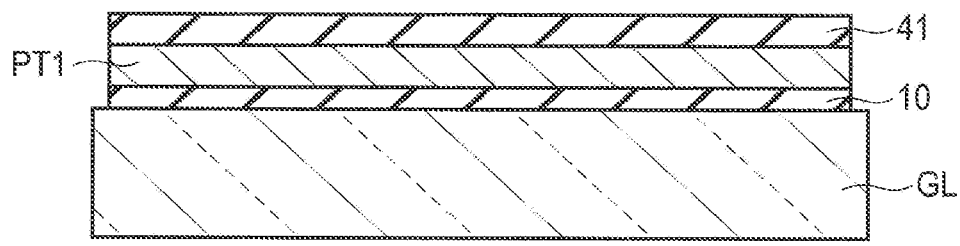
FIG. 7 is a cross-sectional view showing a state in which the first insulating substrate, a first pattern and a sealing layer are formed on the substrate.

FIG. 7 is a cross-sectional view showing a state in which the first insulating substrate 10, a first pattern PT1 and the sealing layer 41 are formed on the substrate GL. Thus, the first insulating substrate 10 comprising the antistatic layer AL is formed on the substrate GL. The antistatic layer AL is broadly formed by the low-resistive layer 9a.

The method for manufacturing the first insulating substrate 10 such that the resistance of the contact area with the substrate GL is low is not particularly limited. This structure can be obtained in various ways. For example, the first insulating substrate 10 may be manufactured by forming a film on the substrate GL twice like the present embodiment. Alternatively, the first insulating substrate 10 may be manufactured by forming a film on the substrate GL once and then dividing the film into two layers. In the latter case, the film can be divided into two layers by applying mixed varnish onto the substrate GL once. In this case, similarly, the electrical resistance is gradually increased from the second surface 10B to the first surface 10A.

Subsequently, the first pattern PT1 located on the first insulating substrate 10 and including the organic electroluminescent elements OLED1 to OLED3, and the sealing layer 41 located on the first pattern PT1 are formed in series.

Figure 8:
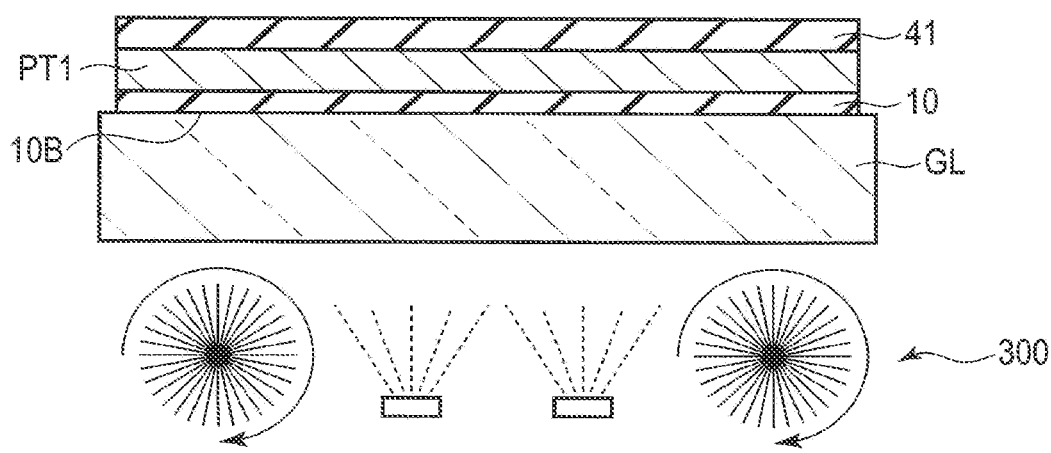
FIG. 8 is a cross-sectional view shown for explaining a step for cleaning the substrate.

FIG. 8 is a cross-sectional view shown for explaining a step for cleaning the substrate.

Subsequently, of the substrate GL, a surface opposite to the surface facing the first insulating substrate 10 is cleaned using a cleaning device 300. Here, the substrate GL is subjected to dry cleaning using a brush, etc. In this way, a foreign substance which may be present on the rear surface of the substrate GL can be removed. At this time, the second surface 10B of the first insulating substrate 10 might be electrically charged. It should be noted that the second surface 10B is formed of the antistatic layer AL. Therefore, even if the above cleaning is applied, the second surface 10B is prevented from being charged. The discharge from the second surface 10B to elements (for example, the switching elements SW1, SW2 and SW3) is difficult to generate. In this way, the destruction of elements at the time of cleaning can be prevented. Dry cleaning is also used for, for example, the flexible printed circuit, when it should not be wet by water.

Figure 9:
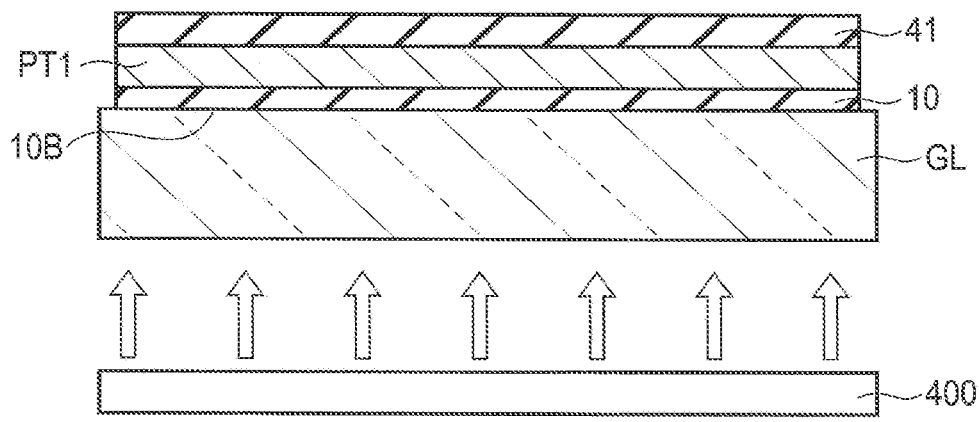
FIG. 9 is a cross-sectional view shown for explaining a step for removing the substrate from the first insulating substrate.

FIG. 9 is a cross-sectional view shown for explaining a step for removing the substrate GL from the first insulating substrate 10.

Subsequently, a laser 400 is used to irradiate the first insulating substrate 10 from the rear surface side of the substrate GL with laser light. The laser light reaches the second surface 10B of the first insulating substrate 10. Ablation which absorbs and resolves the laser light is caused at the interface between the first insulating substrate 10 and the substrate GL. Thus, a space is created at the interface between the substrate GL and the first insulating substrate 10. The substrate GL is removed from the first insulating substrate 10. At this time, for example, the wavelength of the laser light is approximately 308 nm.

At this time, approximately 100 nm of the antistatic layer AL located on the substrate GL side of the first insulating substrate 10 is removed together with the substrate GL. However, the complete removal of the antistatic layer AL can be prevented by setting the thickness of the antistatic layer AL so as to be greater than or equal to 100 nm in advance. In connection with the removal of the substrate GL, the second surface 10B might be electrically charged. However, since the antistatic layer AL has an antistatic function, the second surface 10B is prevented from being charged at the time of removing the substrate GL. Thus, the destruction of elements can be prevented.

As a new effect, improvement in the efficiency of laser lift-off (LLO) can be expected by a synergetic effect of the laser ablation of polyimide and the laser ablation of conductive inorganic particles used for the antistatic layer AL. This effect is not limited to a case of ultraviolet (UV) light irradiation, and can be also expected in a case of infrared (IR) laser irradiation.

Figure 10:
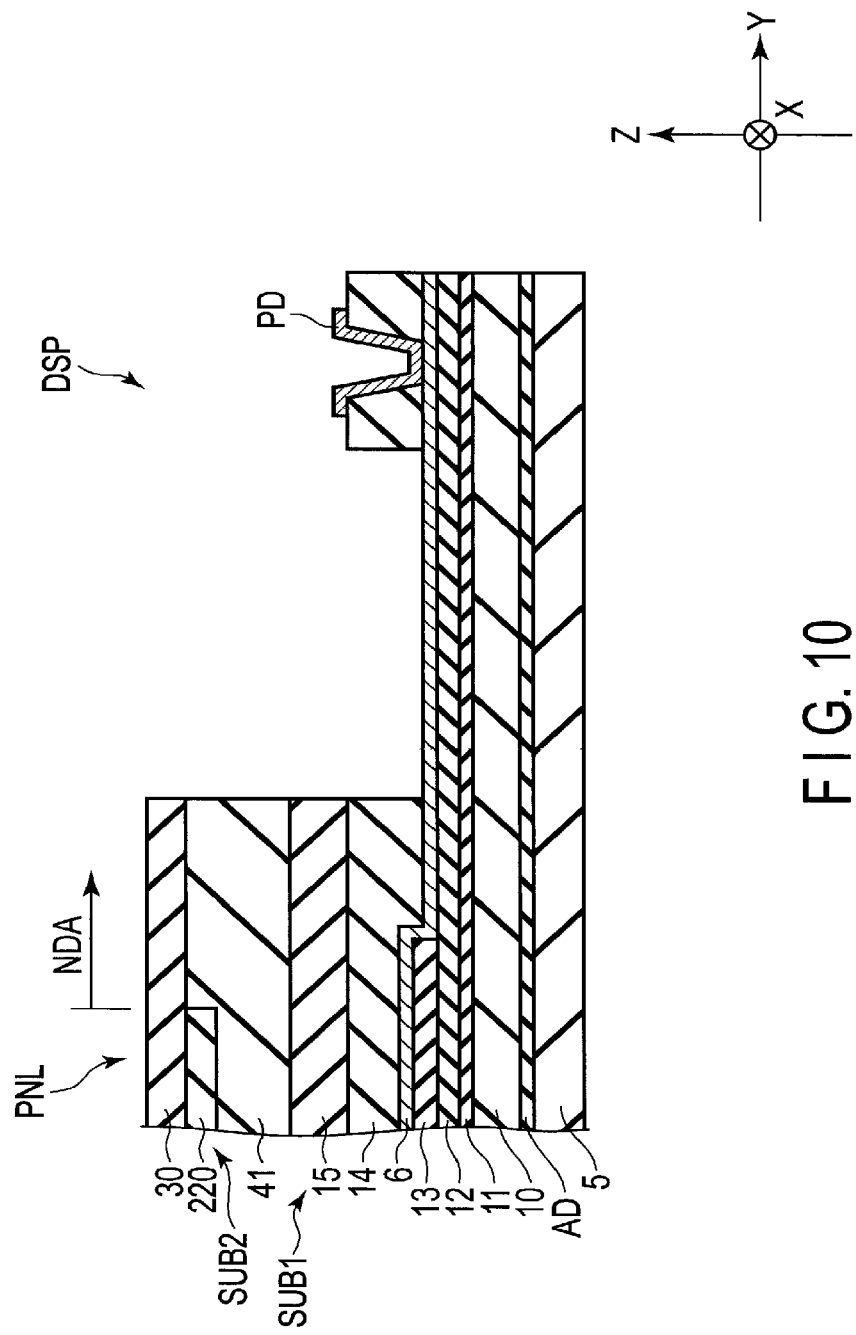
FIG. 10 is a cross-sectional view shown for explaining a step for adhering a supporting member by an adhesion layer.

FIG. 10 is a cross-sectional view shown for explaining a step for adhering the supporting member 5 by the adhesive layer AD.

Subsequently, the supporting member 5 is adhered to the first insulating film 10 by the adhesive layer AD. Specifically, alignment is applied to the supporting member 5 in a state where, for example, an adhesive sheet is provided as the adhesive layer AD between the first insulating film 10 and the supporting substrate 5. Subsequently, heat is applied to adhere the supporting member 5 to the lower surface of the first insulating film 10. In this way, the supporting member 5 is heated after the alignment. Thus, the supporting member 5 can be adhered to a correct position.

Figure 11:
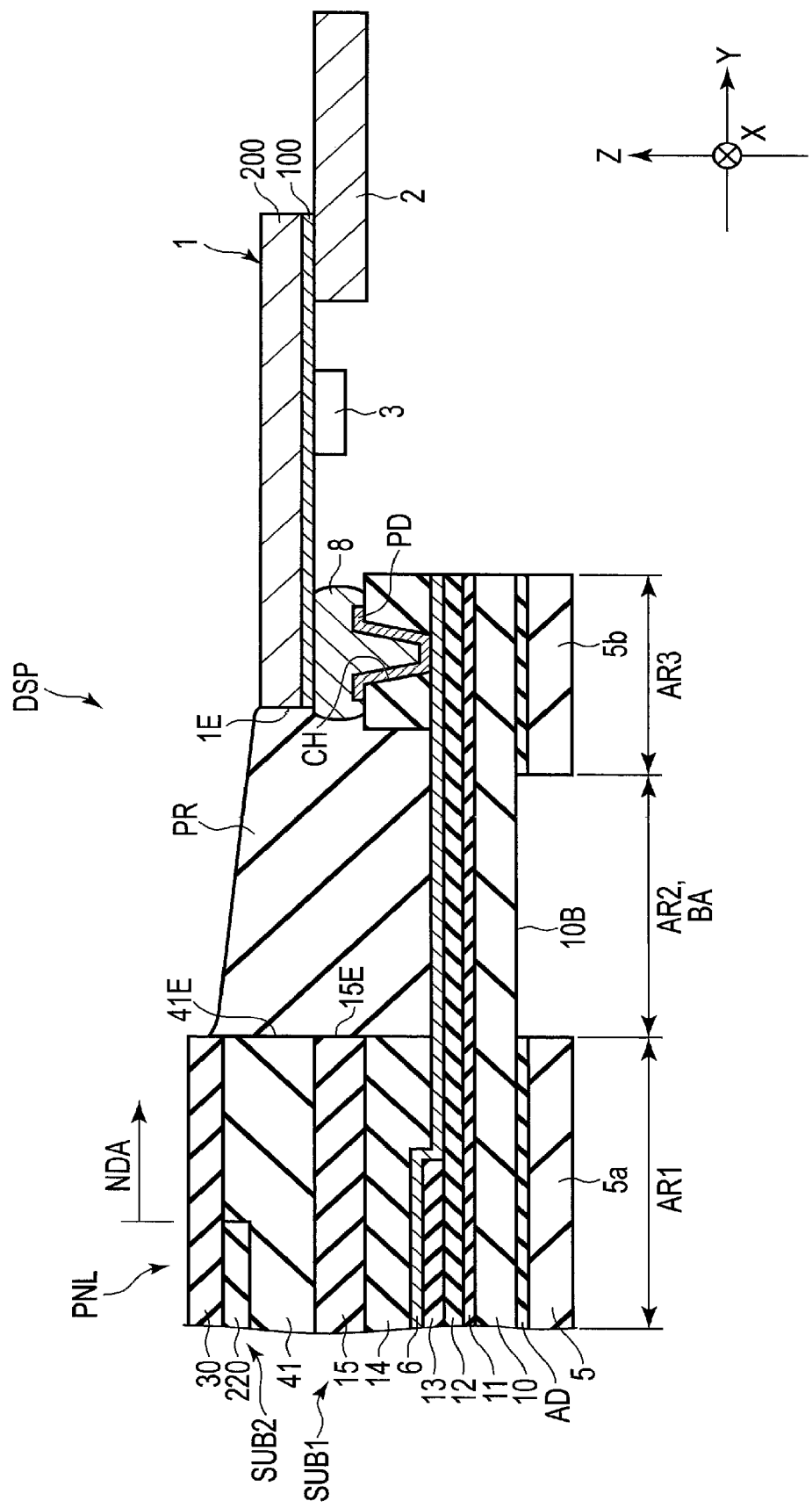
FIG. 11 is a cross-sectional view shown for explaining a step for pressing a circuit board onto a display panel such that they are adhered to each other, and a step for forming a protective layer.

FIG. 11 is a cross-sectional view shown for explaining a step for pressing the circuit board 1 onto the display panel PNL such that they are adhered to each other, and a step for forming the protective layer PR.

Subsequently, the circuit board 1 is mounted on the display panel PNL. The protective layer PR is formed on the display panel PNL.

The anisotropic conductive film 8 is provided at a position overlapping the pad PD between the circuit board 1 and the display panel PNL. Pressure is applied from the upper side of the circuit board 1 and the lower side of the display panel PNL. Subsequently, heat is applied. In this manner, the anisotropic conductive film 8 fuses, and thus, the circuit board 1 and the display panel PNL are electrically and physically connected to each other.

Subsequently, the protective layer PR is formed on the signal line 6. In the example of FIG. 11, the protective layer PR covers an end portion 15E of the rib 15 and an end portion 41E of the sealing layer 41. The protective layer PR also covers an end portion 1E of the circuit board 1. For example, the protective layer PR is formed of an organic insulating material, and is formed by curing with UV irradiation.

Figure 12:
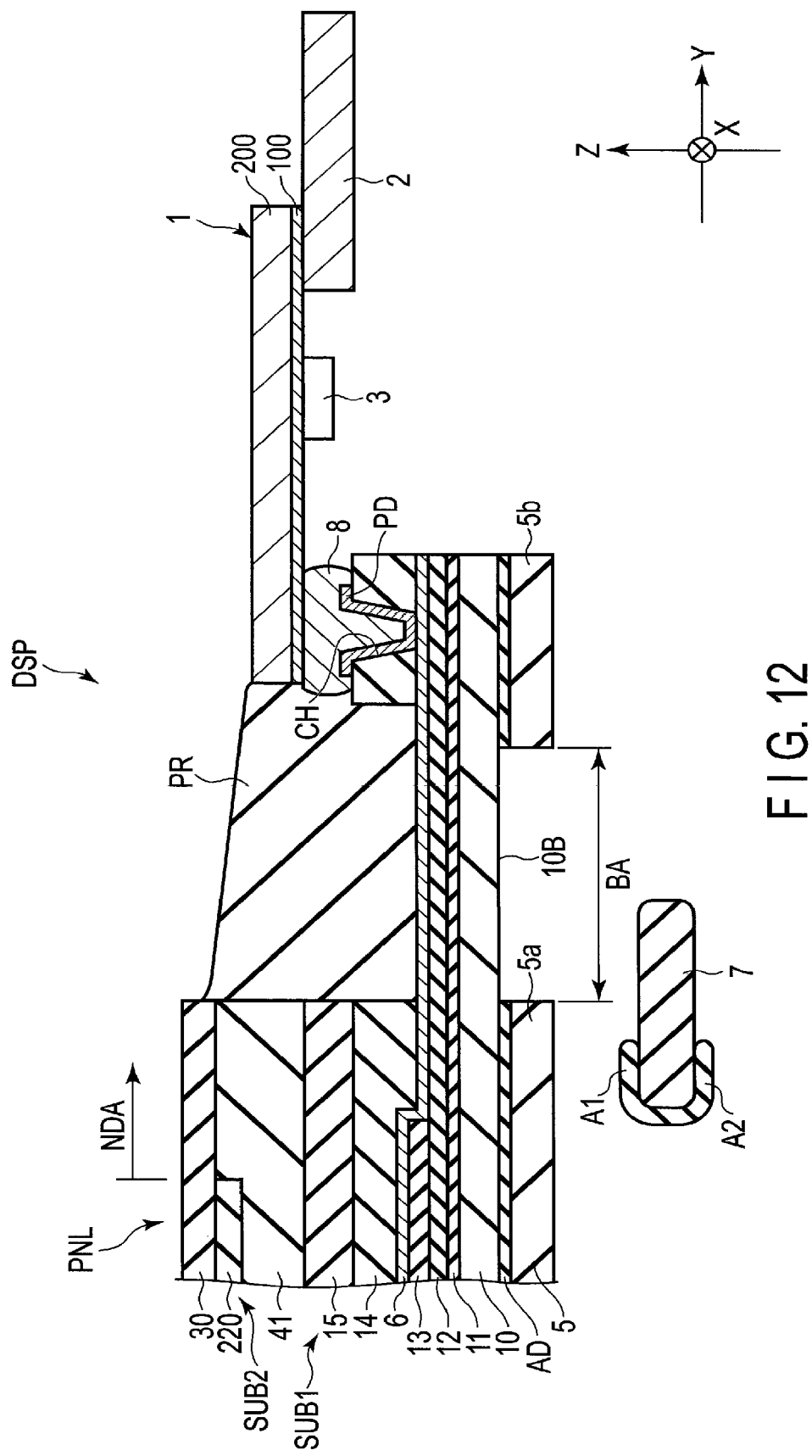
FIG. 12 is a cross-sectional view shown for explaining a step for bending a bend area of the display panel.

FIG. 12 is a cross-sectional view shown for explaining a step for bending the bend area BA of the display panel PNL.

A base 7 is adhered to the first portion 5a by the adhesive layer AD after the position is adjusted. Subsequently, the bend portion BA of the display panel PNL is bent such that the pad PD is located under the display panel PNL. Specifically, the bend portion BA is bent based on the base 7 such that the circuit board 1 is located under the base 7. In this way, the circuit board 1 is adhered to the base 7 by the adhesive layer AD.

In the embodiment described above, the display device DSP comprises the first insulating substrate 10 formed of resin, and the elements formed above the first surface 10A of the first insulating substrate 10 such as the switching elements SW. The first insulating substrate 10 comprises the antistatic layer AL. The antistatic layer AL comprises the second surface 10B, and is formed of an admixture of resin and conductive inorganic particles. Thus, the second surface 10B is prevented from being charged, thereby preventing the destruction of elements.

FIG. 13 is a cross-sectional view showing a state after the bend area BA of the display panel PNL shown in FIG. 12 is bent.

The bend area BA is bent such that the first area AR1 of the display panel PNL faces the circuit board 1. In the present embodiment, the radius of curvature can be less than or equal to 1.0 mm. For example, the radius of curvature of the bend area BA is approximately 0.3 mm. The base 7 is provided between the first area AR1 and the circuit board 1. Since the base 7 is provided, stress is applied from the base 7 to the display panel PNL or the circuit board 1 even for external impact. Thus, the display panel PNL and the circuit board 1 are difficult to damage. In addition, the provision of the base 7 improves the adhesiveness between the first area AR1 and the circuit board 1.

An adhesive layer A1 is provided between the first area AR1 and the base 7 such that they are adhered to each other. An adhesive layer A2 is provided between the circuit board 1 and the base 7 such that they are adhered to each other. The adhesive layers A1 and A2 may be continuously formed as shown in FIG. 13, or may be separately formed. The adhesive layers AD1 and AD2 are, for example, double-faced tape.

In the present embodiment, the first insulating substrate 10 comprises the antistatic layer AL. Thus, it is possible to prevent the first insulating substrate 10 from being charged at the time of removing another substrate. In this way, reduction in manufacturing yield can be prevented. When the bend portion BA of the display panel PNL is bent as described above, the frame region of the electronic device, etc., housing the display panel PNL can be made narrower, or can be reduced in size. In addition, the volume for accommodation can be reduced without decreasing the width of the non-display area NDA.

As explained above, the present embodiment can achieve a display device DSP capable of preventing reduction in manufacturing yield, and a method of manufacturing the display device DSP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, FIG. 14 is a cross-sectional view showing a modification example of the first insulating substrate 10 of the display panel PNL according to the above embodiment. As shown in FIG. 14, the antistatic layer AL may further comprise the first surface 10A and form the entire first insulating substrate 10. For example, the first insulating substrate 10 is formed of a polyimide substrate containing conductive inorganic particles. In this case, thickness TAL of the antistatic layer AL is equal to the whole thickness T10 of the first insulating substrate 10 (TAL=T10).

FIG. 15 is a cross-sectional view showing a modification example of the antistatic layer AL of the display panel PNL according to the above embodiment. As shown in FIG. 15, the antistatic layer AL may be separately formed from the first insulating substrate 10 on the second surface 10B of the first insulating substrate. The antistatic layer AL is located between the first insulating substrate 10 and the supporting member 5. In this case, thickness TAL of the antistatic layer AL is less than the whole thickness T10 of the first insulating substrate 10. Thickness TAL of the antistatic layer AL is less than 200 nm. For example, thickness TAL is less than 100 nm. Thickness T10 of the first insulating substrate 10 is approximately 10 to 20 µm. The resistance of the antistatic layer AL is less than that of the first insulating substrate 10.

The above embodiments are not limited to an organic electro-luminescent display device, and may be applied to a liquid crystal display device. In this case, the display panel PNL is, for example, a liquid crystal display panel comprising a liquid crystal layer held between the first substrate SUB1 and the second substrate SUB2. When the display panel PNL is a liquid crystal display panel, the liquid crystal display panel may be either a reflective type liquid crystal display panel, which displays an image by selectively reflecting light made incident through the second substrate SUB2 side, or a transmissive type liquid crystal display panel, which displays an image by selectively transmitting light made incident through the first substrate SUB1 side. When the display area DA overlaps the circuit board 1 as seen in plan view, a reflective type is preferably employed. However, when a backlight unit can be provided between the first substrate SUB1 and the circuit board 1, a transmissive type may be employed. Even when the display device DSP is a liquid crystal display device, its main structures are substantially the same as those of the embodiments.

What is claimed is:

1. An electronic device comprising:
    an insulating substrate comprising a first surface, and a second surface opposite to the first surface;
    a circuit board mounted on the first surface;
    a supporting member adhered to the insulating substrate on the second surface; and
    an antistatic layer located between the insulating substrate and the supporting member,
    wherein
    a resistance of the antistatic layer is less than a resistance of the insulating substrate.

2. The electronic device of claim 1, wherein
    the antistatic layer is formed of an admixture of resin and conductive inorganic particles.

3. The electronic device of claim 1, wherein
    a thickness of the antistatic layer is less than a thickness of the entire insulating substrate.

4. The electronic device of claim 1, wherein
    a thickness of the antistatic layer is equal to a thickness of the entire insulating substrate.

5. An electronic device comprising:
    an insulating substrate comprising a first area, a second area adjacent to the first area, and a third area adjacent to the second area;
    a circuit board mounted in the third area of the insulating substrate;
    a base provided between the first area of the insulating substrate and the circuit board;
    an adhesive layer provided between the circuit board and the base, and between the first area of the insulating substrate and the base; and
    a supporting member adhered to the insulating substrate on a side opposite to a side on which the circuit board is mounted, wherein
    the insulating substrate is formed of a polyimide substrate containing conductive inorganic particles, and
    the second area of the insulating substrate is bent such that the first area of the insulating substrate faces the circuit board.

6. The electronic device of claim 5, wherein
    the insulating substrate comprises a first surface on the side on which the circuit board is mounted, and a second surface on the side on which the supporting member is mounted, and the side on which the second surface is mounted is opposite to the side on which the first surface is mounted, and
    an electrical resistance is highest on the first surface side, is lowest on the second surface side, and is gradually increased from the second surface to the first surface.

7. The electronic device of claim 5, wherein
    the supporting member is not provided in the second area.

* * * * *